(12) United States Patent
Vegas Olmos et al.

(10) Patent No.: US 11,791,902 B2
(45) Date of Patent: Oct. 17, 2023

(54) HETEROGENEOUS INTEGRATION OF FREQUENCY COMB GENERATORS FOR HIGH-SPEED TRANSCEIVERS

(71) Applicant: Mellanox Technologies, Ltd., Yokneam (IL)

(72) Inventors: Juan Jose Vegas Olmos, Solrød Strand (DK); Elad Mentovich, Tel Aviv (IL); Paraskevas Bakopoulos, Ilion (GR); Dimitrios Kalavrouziotis, Papagou (GR)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 4 days.

(21) Appl. No.: 17/147,312

(22) Filed: Jan. 12, 2021

(65) Prior Publication Data

US 2022/0190922 A1 Jun. 16, 2022

(30) Foreign Application Priority Data

Dec. 16, 2020 (GR) .............................. 20200100735

(51) Int. Cl.
*H01S 5/10* (2021.01)
*H01S 5/50* (2006.01)
(Continued)

(52) U.S. Cl.
CPC ....... *H04B 10/5051* (2013.01); *H01S 5/0078* (2013.01); *H01S 5/0085* (2013.01);
(Continued)

(58) Field of Classification Search
CPC .... H01S 5/142; H01S 5/4062; H01S 5/06255; H01S 5/0622; H01S 5/0656;
(Continued)

(56) References Cited

U.S. PATENT DOCUMENTS 4,677,630 A * 6/1987 Fujita ...................... H01S 5/026
  372/50.1
5,231,533 A * 7/1993 Gonokami .............. G02F 1/355
  372/18
(Continued)

FOREIGN PATENT DOCUMENTS

CN       102377098 A  *  3/2012  ........... H01S 5/0656
CN       104966989 A  *  10/2015  ............... H01S 5/06
(Continued)

OTHER PUBLICATIONS

Lu et al., "Optical Kerr Nonlinearity in a High-Q Silicon Carbide Microresonator", 2014 Optical Society of America, Optics Express, vol. 22, No. 25, 30826-3832 (Year: 2014).*

*Primary Examiner* — Joshua King
(74) *Attorney, Agent, or Firm* — Moore & Van Allen PLLC; Anup Shrinivasan Lyer

(57) ABSTRACT

A photonics frequency comb generator includes two integrated dies: an indium phosphide die laser of a first wavelength is grown on from, and a silicon photonics die having a microring resonator connected to the laser and frequency modulators. The microring resonator converts the first wavelength into a number of second wavelengths. One type of the microring resonator is a hybrid non-linear optical wavelength generator, comprising non-silicon materials, such as SiC or SiGe built on silicon to yield a non-linear wavelength generation. The second wavelengths are generated by adjusting the ring's geometric size and a distance between the ring and the traverse waveguide. Another type of microring resonator splits the first wavelength into a plurality of second wavelengths and transmits the multiple second wavelengths to filters and modulators, and each selects and modulates one of the second wavelengths in a one-to-one relationship. This frequency comb generator has applica- (Continued)

tions in WDM/CWDM and multi-chip modules in high speed transceivers.

22 Claims, 9 Drawing Sheets

(51) Int. Cl.
  *H01S 5/06* (2006.01)
  *H01S 5/026* (2006.01)
  *H01S 5/00* (2006.01)
  *H04B 10/50* (2013.01)

(52) U.S. Cl.
  CPC ............ *H01S 5/0092* (2013.01); *H01S 5/026* (2013.01); *H01S 5/0265* (2013.01); *H01S 5/0604* (2013.01); *H01S 5/1028* (2013.01); *H01S 5/1071* (2013.01); *H01S 5/5054* (2013.01)

(58) Field of Classification Search
  CPC ....... H01S 5/0653–0655; H01S 5/4006; H01S 5/1092–1096; H01S 5/026–0268; H01S 5/0085; H01S 5/0265; H01S 5/0092; H01S 5/0604; H01S 5/5054; G02B 2006/12085; G02B 2006/12121
  See application file for complete search history.

(56) References Cited

U.S. PATENT DOCUMENTS

| | | | | |
|---|---|---|---|---|
| 5,555,253 | A * | 9/1996 | Dixon | H01S 5/141 372/100 |
| 6,891,865 | B1 * | 5/2005 | Ma | H01S 5/141 372/20 |
| 7,630,417 | B1 * | 12/2009 | Maleki | G02F 1/353 385/5 |
| 8,102,597 | B1 * | 1/2012 | Maleki | G02B 6/29341 372/92 |
| 8,111,722 | B1 * | 2/2012 | Maleki | G02F 1/353 372/18 |
| 8,331,008 | B1 * | 12/2012 | Matsko | G02B 6/29341 359/239 |
| 8,331,409 | B1 * | 12/2012 | Liang | H01S 3/1303 372/29.016 |
| 8,514,400 | B2 * | 8/2013 | Mohageg | G01C 19/72 356/459 |
| 8,681,827 | B2 * | 3/2014 | Maleki | H03B 17/00 372/21 |
| 9,348,154 | B2 * | 5/2016 | Hayakawa | G02F 1/225 |
| 9,897,827 | B1 * | 2/2018 | Kim | G02B 6/2746 |
| 2002/0018611 | A1 * | 2/2002 | Maleki | G02B 6/34 372/92 |
| 2002/0105998 | A1 * | 8/2002 | Ksendzov | H01S 5/1032 372/92 |
| 2004/0228564 | A1 * | 11/2004 | Gunn, III | G02B 6/12004 385/1 |
| 2005/0025199 | A1 * | 2/2005 | Ma | H01S 5/141 372/20 |
| 2005/0175358 | A1 * | 8/2005 | Ilchenko | G02F 1/011 398/198 |
| 2005/0286602 | A1 * | 12/2005 | Gunn | G02B 6/12007 372/50.1 |
| 2008/0285606 | A1 * | 11/2008 | Kippenberg | G02F 1/39 372/32 |
| 2008/0310463 | A1 * | 12/2008 | Maleki | H01S 5/1032 372/20 |
| 2009/0078963 | A1 * | 3/2009 | Khodja | H01S 5/0261 257/458 |
| 2010/0034223 | A1 * | 2/2010 | Osinski | H01S 5/026 977/773 |
| 2010/0118375 | A1 * | 5/2010 | Maleki | G02F 1/0353 372/18 |
| 2010/0135346 | A1 * | 6/2010 | Peters | H04J 14/02 372/29.011 |
| 2011/0069975 | A1 * | 3/2011 | Liu | H04B 10/614 398/202 |
| 2011/0150485 | A1 * | 6/2011 | Seidel | G02F 2/002 398/115 |
| 2011/0182584 | A1 * | 7/2011 | Gottwald | H04B 10/63 398/79 |
| 2011/0206376 | A1 * | 8/2011 | Gottwald | H04J 14/0298 398/76 |
| 2011/0304853 | A1 * | 12/2011 | Yamada | H01S 5/14 372/20 |
| 2011/0310917 | A1 * | 12/2011 | Krishnamoorthy | H04B 10/506 372/23 |
| 2012/0039346 | A1 * | 2/2012 | Liang | H01S 5/1075 372/20 |
| 2012/0063474 | A1 * | 3/2012 | Ayotte | H01S 5/0078 372/20 |
| 2012/0294319 | A1 * | 11/2012 | Maleki | G02F 1/39 372/18 |
| 2012/0320939 | A1 * | 12/2012 | Baets | H01S 5/1032 372/45.01 |
| 2013/0003766 | A1 * | 1/2013 | Savchenkov | H01S 5/142 372/32 |
| 2013/0195446 | A1 * | 8/2013 | Zheng | H04B 10/506 398/34 |
| 2014/0133511 | A1 * | 5/2014 | Tanaka | H01S 5/125 372/50.22 |
| 2014/0205286 | A1 * | 7/2014 | Ji | H04J 14/0298 398/45 |
| 2014/0321848 | A1 * | 10/2014 | Sekiguchi | H04B 10/516 398/38 |
| 2015/0016767 | A1 * | 1/2015 | Akiyama | G02F 1/225 385/3 |
| 2015/0323743 | A1 * | 11/2015 | Nicholson | G02B 6/29343 385/24 |
| 2015/0323818 | A1 * | 11/2015 | Padmaraju | G02F 1/0147 359/288 |
| 2016/0011489 | A1 * | 1/2016 | Herr | G02B 6/29338 385/2 |
| 2016/0134078 | A1 * | 5/2016 | Gaeta | H01S 5/5063 372/20 |
| 2016/0204576 | A1 * | 7/2016 | Chen | H01S 5/142 372/45.01 |
| 2016/0218481 | A1 * | 7/2016 | Akiyama | G02F 1/225 |
| 2016/0261091 | A1 * | 9/2016 | Santis | H01S 5/1032 |
| 2016/0327743 | A1 * | 11/2016 | Kippenberg | G02B 6/136 |
| 2017/0207600 | A1 * | 7/2017 | Klamkin | H01S 5/1032 |
| 2018/0026426 | A1 * | 1/2018 | Kawakita | H01S 5/026 372/20 |
| 2018/0083599 | A1 * | 3/2018 | Kippenberg | H04B 10/63 |
| 2018/0095003 | A1 * | 4/2018 | Vahala | G02F 2/02 |
| 2018/0205463 | A1 * | 7/2018 | Karpov | G02F 1/073 |
| 2018/0231808 | A1 * | 8/2018 | Zheng | G02B 6/12007 |
| 2018/0291731 | A1 * | 10/2018 | Stark | H04B 10/506 |
| 2018/0307118 | A1 * | 10/2018 | Sciancalepore | G02F 1/395 |
| 2019/0097383 | A1 * | 3/2019 | Akiyama | H01S 5/50 |
| 2019/0140415 | A1 * | 5/2019 | Sun | H01S 5/1215 |
| 2019/0214789 | A1 * | 7/2019 | Santis | G02F 1/35 |

FOREIGN PATENT DOCUMENTS

| | | | | |
|---|---|---|---|---|
| CN | 105515677 | A * | 4/2016 | |
| CN | 106559142 | A * | 4/2017 | ....... H04B 10/25752 |
| EP | 3190672 | A1 * | 7/2017 | ............ H01S 5/021 |
| EP | 3657243 | A1 * | 5/2020 | ............... G02F 1/35 |
| GB | 2502701 | A * | 12/2013 | ............. G01N 21/39 |
| WO | WO2009054526 | A1 * | 3/2011 | |
| WO | WO-2014131425 | A1 * | 9/2014 | ......... G02B 6/29338 |
| WO | WO-2015001421 | A2 * | 1/2015 | ........... H01S 5/1032 |
| WO | WO-2017050053 | A1 * | 3/2017 | ....... H04B 10/25752 |
| WO | WO-2018235317 | A1 * | 12/2018 | ............... G02B 6/26 |
| WO | WO-2019002763 | A1 * | 1/2019 | ........... H01S 5/1032 |

* cited by examiner

HETEROGENEOUS INTEGRATION OF FREQUENCY COMB GENERATORS FOR HIGH-SPEED TRANSCEIVERS

CROSS REFERENCE

The application claims priority to Greece Patent Application No. 20200100735, filed on Dec. 16, 2020 the disclosure of which is incorporated herein by reference in its entirety.

TECHNICAL FIELD

The invention relates to the field of telecommunications. In particular, the invention relates to high-speed photonics transceivers for interconnects.

BACKGROUND

Datacenters rely on a fast and robust communication infrastructure. This is achieved by using optical interconnects, especially between different server racks. Each physical link employing a single optical fiber includes multiple communication channels, which are distinguished by different wavelengths in wavelength division multiplexing (WDM) systems.

The transmitters in optical WDM transceiver modules are typically based on arrays of discrete single wavelength lasers, such as the distributed feedback (DFB) lasers. However, in order to decrease power consumption and complexity, these lasers could be replaced by a single comb laser. The comb laser generates a range of discrete, equally spaced frequencies.

As transceivers increase their line bitrate, currently from 25 Gbit/s to 50 Gbit/s and then to 100 Gbit/s, as well as upgrade the modulation order from present techniques like non-return-to-zero (NRZ) to pulse amplitude modulation level 4 (PAM-4), the challenge is how to scale the power consumption by the laser sources because these increments require an increase in the signal-to-noise ratio (SNR) of the transmitter.

For example, when moving from NRZ to PAM-4 at the same bitrate, the SNR is reduced by a factor of 3. Therefore, the power needs to increase by a factor of 3 just to maintain the same bit error rate (BER) count as before.

When moving from a PAM-4 to PAM-8 (PAM level 8), both operating at the same bitrate, the SNR needs to be increased to ensure the PAM-8 signal reach the same BER as in the case of PAM-4.

Supporting a sustainable relation between SNR and BER typically requires increasing the available power provided by the laser source, which increases cost. As a result, lasers need to generate more light, which in turn, increases the power consumption above a linear scaling and introduces heat dissipation strain and thermal management challenges, at the same time.

This is particularly relevant for transceivers that need to be encapsulated in standardized pluggable forms, which have limited heat dissipation properties and small space, such that they rely on air flow design, thereby limiting the amount of power transceivers can take from the main rack by the form-factor standards.

Frequency comb generators seek to replace arrays of discrete laser sources with one single wavelength laser source. The light from the laser is subsequently split into several different light beams at different wavelengths, and each of these beams is used to convey an individual data stream.

Traditional frequency comb generators have been constructed using discrete components for applications that allow for a large footprint, such as in the fields of metrology and sensing. Such devices, however, are bulky and do not meet requirements for the integrated photonics challenge.

The existing integrated frequency comb generators are either designed for silicon photonics platforms, or other III-V semiconductor platforms, such as indium phosphide (InP) based optical devices. A generic diagram for each of the technologies is shown in FIG. 1A and FIG. 1B.

FIG. 1A shows a schematic of an existing frequency comb generator based on silicon photonics only. The silicon photonics approach shown in FIG. 1A always requires an external laser source, which can be flip-chip mounted on the silicon photonics die or attached through an input fiber connection. The combed or split frequency outputs are shown as an array of outputs connected to optical fibers.

On the other hand, the indium phosphide approach, as shown in FIG. 1B, allows for the laser source to be grown within the indium phosphide die. At the same time, the other components are also arranged to be grown on the indium phosphide die. In FIG. 1B, the system does not require an external laser source mounting, so the system-on-chip approach is simplified. The combed or split frequency outputs are shown as an array of outputs connected to optical fibers.

In both cases, optical fibers are configured applied to interface with the system die, either through v-grooves or vertical gratings. As described above, most approaches for frequency comb generators focus on a single technology platform: either fully silicon photonics or only indium phosphide.

The following tables highlight the pros and cons of the current frequency comb generators based on each technology: Table 1 lists pros and cons of frequency comb generators in a pure silicon photonics system and Table 2 lists pros and cons of frequency comb generators in a pure indium phosphide system.

TABLE 1

| Silicon photonics | |
| --- | --- |
| Pros | Cons |
| Low cost | Low yield due to laser attachment |
|  | High insertion losses in the waveguides |

TABLE 2

| Indium phosphide | |
| --- | --- |
| Pros | Cons |
| Laser grown on die | High cost |
| Amplifying blocks can be added | High noise due to amplification |

Therefore, the problem is how to move from the existing single-technology oriented design to heterogeneous integration that uses both technologies for what is most suitable (i.e., indium phosphide for light generation and silicon photonics for light modulation).

Hence, there remains a need to develop an integrated circuit (IC) compatible frequency comb generator that allows for the possibility of being integrated into photonics chips.

BRIEF SUMMARY

According to an embodiment of the current disclosure, a photonics frequency comb generator is presented, which comprises: a first die, wherein the first die comprises a light source grown on an indium phosphide material; a second die, wherein the second die comprises an optical wavelength generator placed on a silicon photonics substrate, wherein the first die and the second die are integrated together; an input terminal connecting to the first die; and an output terminal connected to the second die.

In some examples, the light source is a laser grown on the indium phosphide material, and wherein the laser emits a first wavelength.

In some examples, the optical wavelength generator is a microring resonator interconnected to the laser.

In some examples, the silicon photonics substrate comprises: filters and modulators connected to the microring resonator; wherein the microring resonator is configured to convert the first wavelength into a plurality of second wavelengths; and wherein one of the filters selects one of the plurality of second wavelengths, and transmits said wavelength to one of the modulators in a one-to-one relationship.

According to another embodiment of the current disclosure, a photonics frequency comb generator is provided that includes: a first die, wherein the first die comprises a light source grown on an indium phosphide material; a second die, wherein the second die comprises a non-linear optical wavelength generator placed on a silicon photonics substrate, wherein the first die and the second die are integrated together; an input terminal connecting to the first die; and an output terminal connected to the second die.

In some examples, the light source is a laser grown on the indium phosphide material, and wherein the laser emits a first wavelength.

In some examples, the non-linear optical wavelength generator is a microring resonator comprising hybrid materials and wherein the microring resonator is interconnected to the laser.

In some examples, the hybrid materials comprise non-silicon materials, such as silicon carbide (SiC) or silicon germanium (SiGe).

In some examples, the SiC material is fabricated using a technique comprising: 1) growing SiC on top of a silicon photonics substrate through an intermediate layer or PVD deposition; 2) performing flip-chip of a SiC die directly on the silicon photonics substrate; 3) performing flip-chip of the SiC die directly on the silicon photonics substrate; 4) attaching the SiC die through a polymer glass interposer, where the silicon carbide die and the silicon photonics substrate are next to each other; and 5) attaching through a fiber, which is connected to the SiC die and the silicon photonics substrate through waveguide tapers.

In some examples, a waveguide bus connects a plurality of microring modulators with the microring resonator, and the microring resonator is configured to convert the first wavelength into a plurality of second wavelengths, wherein the plurality of second wavelengths from the microring resonator is distributed into the waveguide bus, and wherein one of the plurality of microring modulators selects and transmits one of the plurality of second wavelengths from the waveguide bus into said microring modulators in a one-to-one relationship.

In some examples, converting the first wavelength into the plurality of second wavelengths is achieved by adjusting a geometric size of the microring resonator and a distance between the microring and the waveguide bus.

In some examples, the light source grown on the indium phosphide material is a semiconductor optical amplifier (SOA) to provide gain to the first wavelength emitted by a laser oscillator cavity on the second die.

According to another embodiment of the current disclosure, a multi-chip module is provided having a photonics frequency comb generator, which includes: a first die, having a light source grown on an indium phosphide material; a second die, wherein the second die comprises an optical wavelength generator placed on a silicon photonics substrate; wherein the first die and the second die are connected by an optical waveguide; an input terminal connecting to the first die; and an output terminal connected to the second die.

In some examples, the optical waveguide connecting the first die and the second die comprises one of optical fiber, a polymer waveguide, and a glass waveguide.

In some examples, the light source is a laser grown on the indium phosphide material, and wherein the laser emits a first wavelength.

In some examples, the optical wavelength generator is a microring resonator connected to the laser.

In some examples, the silicon photonics substrate comprises: multiple channels of filters and modulators connected to the microring resonator; wherein the microring resonator is configured to convert the first wavelength into a plurality of second wavelengths; and wherein one of the filters selects one of the plurality of second wavelengths and transmits said wavelength to one of the modulators in a one-to-one relationship.

In some examples, a third die is provided, which connects to the second die, wherein the third die is an electronics die comprising circuits for electronic manipulation of signals, including equalization, coding, switching, and logic operations.

According to another embodiment of the current disclosure, a multi-chip module (MCM) has N photonics frequency comb generators, each comprising a pair of the first die and the second die.

In some examples, the MCM further comprises an electronics die connecting to the N photonics frequency comb generators, respectively, via a multi-lane waveguide, wherein the electronics die comprises circuits for electronic manipulation of signals, including equalization, coding, switching, and logic operations.

According to another embodiment of the current disclosure, an M-channel WDM module is provided, which includes the photonics frequency comb generators described above.

In some examples, a number of filters and a number of modulators are both M=4, wherein M is a positive integer 1, 2, . . . M and M=4 is 4, 8, . . . M.

According to another embodiment of the current disclosure, an M-channel CWDM module is provided, comprising the photonics frequency comb generators as disclosed above.

In some examples, a number of filters and a number of modulators are both M'×4, wherein M' is a positive integer 1, 2, . . . M'.

BRIEF DESCRIPTION OF THE DRAWING(S)

Having thus described the invention in general terms, reference will now be made to the accompanying drawings, which are not necessarily drawn to scale.

DETAILED DESCRIPTION OF THE INVENTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "bottom," "front," etc. are used for explanatory purposes in the examples provided below to describe the relative position of certain components or portions of components. Accordingly, as an example, the term "top current spreading layer" may be used to describe a current spreading layer; however, the current spreading layer may be on the top or on the bottom, depending on the orientation of the particular item being described.

With the introduction of photonics integrated circuits, frequency comb generators now have the possibility to be integrated into photonics chips and achieve small sizes that are, therefore, capable of being used in integrated transceivers.

Figure 1A:
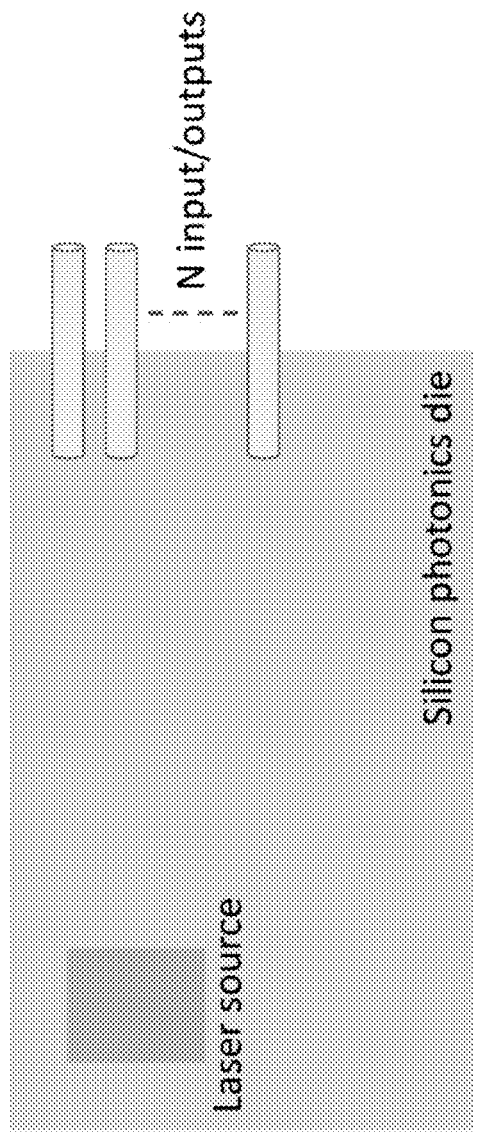
FIG. 1A shows a schematic diagram of an existing frequency comb generator based on silicon photonics technology only.
Figure 1B:
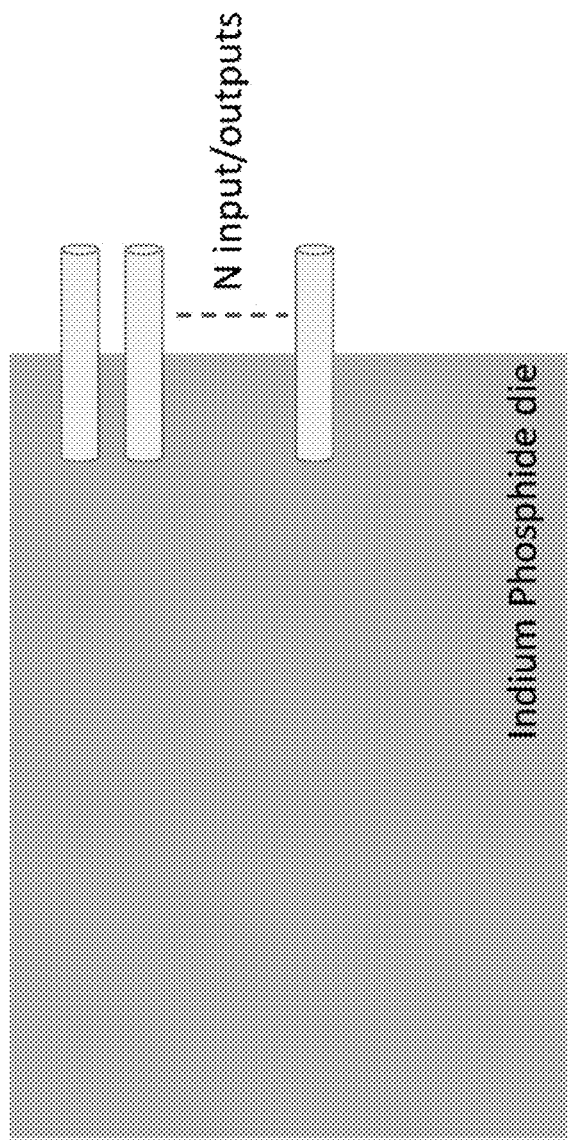
FIG. 1B shows a schematic diagram of an existing frequency comb generator based on indium phosphide technology only.
Figure 2:
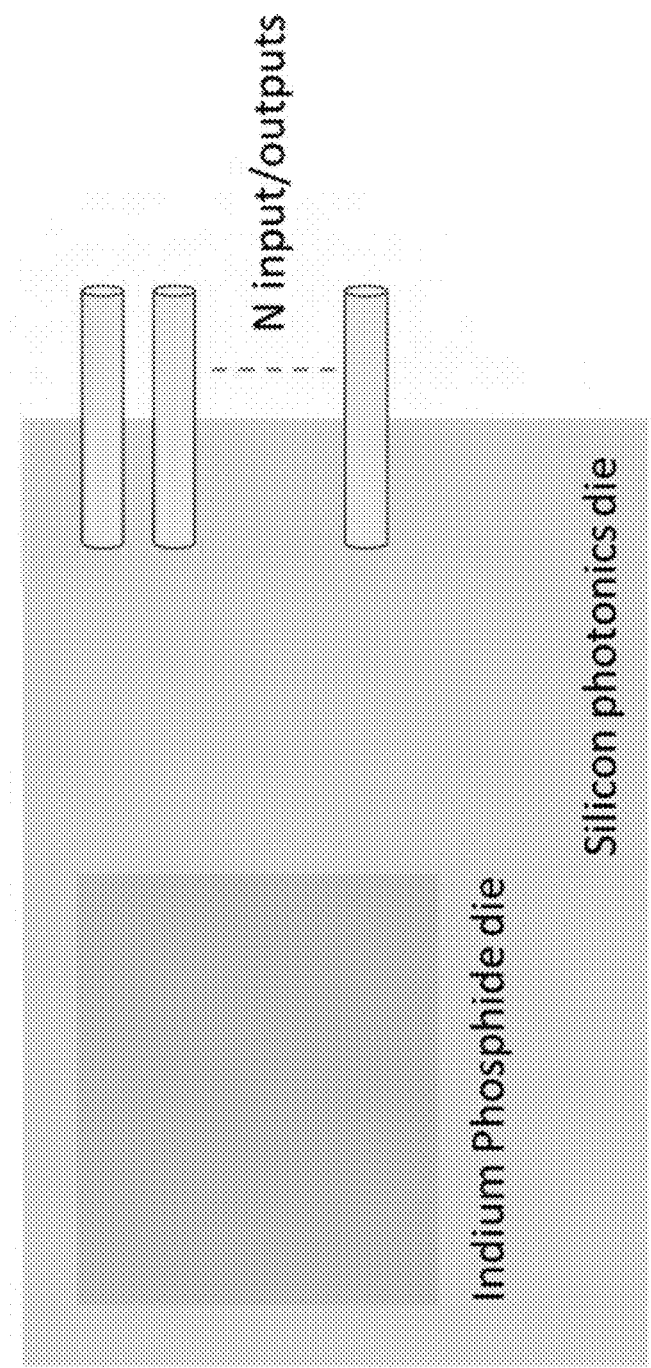
FIG. 2 shows a hybrid frequency comb generator using an indium phosphide die flip-chip mounted on a silicon photonics die, according to some embodiments of the current disclosure.

FIG. 2 shows a hybrid frequency comb generator according to some embodiments of the current disclosure. In FIG. 2, an indium phosphide die is flip-chip mounted on a silicon photonics die, and a number of fibers or waveguides serve as the inputs and outputs.

Figure 3:
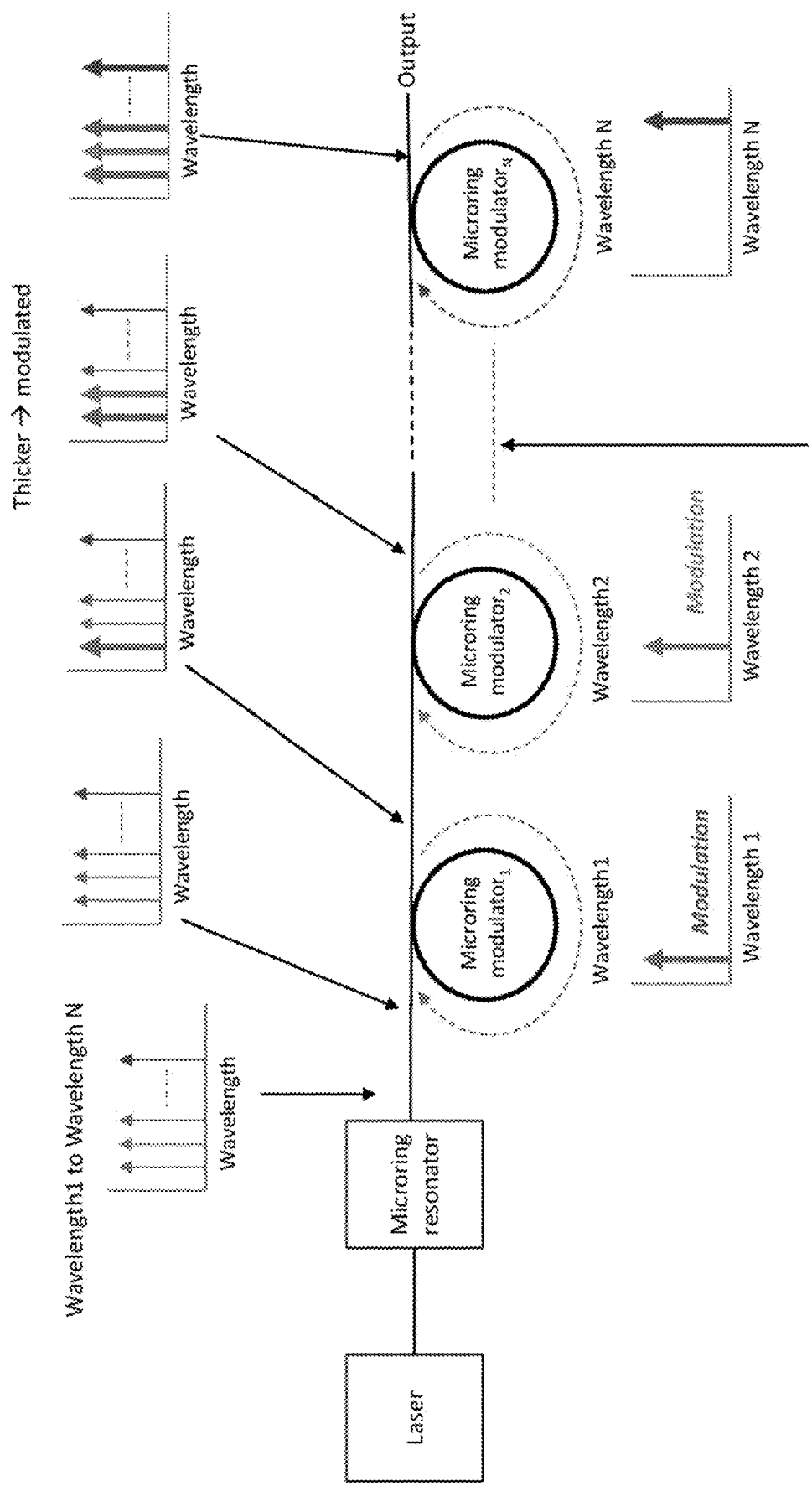
FIG. 3 shows a schematic diagram of a frequency comb generator having a bus waveguide followed by multiple microring modulators, according to some embodiments of the current disclosure.

FIG. 3 illustrates a schematic diagram of a frequency comb generator, according to some embodiments of the current disclosure.

In FIG. 3, the frequency comb generator includes a laser, a microring resonator, a bus waveguide of multiple wavelength lines followed by a number of microring modulators matching individual wavelength lines, such that each microring modulator modulates one wavelength line directly. Therefore, specific wavelength lines are extracted by corresponding microring resonators and are modulated individually.

The indium phosphide die includes a laser source and/or a semiconductor optical amplifier (SOA). The laser has a narrow frequency band emitting UV, visible, or IR light. The laser can be a fiber laser or a VCSEL laser grown on an III-V semiconductor substrate, such as the InP die, but not limited to the InP die only.

The laser light is guided by an integrated coupling to an input of a microring resonator on the silicon photonics die. The microring resonator broadens the wavelength from the laser by a nonlinear property that expands the narrow wavelength bandwidth from the laser source into a number of wavelengths, wavelength 1 to wavelength N shown in FIG. 3, or simply wavelengths in a broader spectrum.

To achieve that, a mechanism of generating non-linear light from the single wavelength from the laser output is required. In order to increase the nonlinearity of the microring resonator, the microring resonator may be built with a heterogeneous structure, i.e., on silicon photonics using non-silicon material, for example, silicon carbide, or silicon germanium (SiGe) rather than only silicon material. In this way, the microring resonator may yield high non-linear mixing and generate a spread over several wavelengths of the incoming wavelength signal from the indium phosphide laser/amplifier. This hybrid non-linear microring resonator on the silicon based photonics involves a fabrication process that allows or is compatible with growing the non-silicon materials on the silicon die, or at least can be integrated with the non-silicon die.

The choice of SiC comes from a few favorable characters of its material properties. SiC has a wide bandgap (2.4 to 3.2 eV), corresponding to a wide low-loss transmission window (400-5000 nm), which covers the operational transmission band for fiber optic communications. SiC fabrication is compatible with Complementary metal-oxide-semiconductor (CMOS), compared to non-compatible indium gallium arsenide (InGaAs), Aluminium nitride (AlN), and Lithium niobate (LiNbO3). SiC has both second-order and third-order optical nonlineatiry, as frequency comb generation can rely partly on its high third-order nonlinearity. In addition, silicon carbide has good thermal conductivity, with its thermal conductive coefficient 3 times higher than that of silicon.

A microring resonator can be fabricated with SiC using a CMOS compatible process in the temperature range of 800 degrees C. to 1000 degrees C. for single crystalline 3C-SiC or 400 degrees for amorphous and nanocrystaline 3C-SiC. Processes such as chemical vapor deposition (CVD), physical vapor deposition (PVD), or plasma enhanced chemical vapor deposition (PECVD) may be used.

In some cases, crystalline SiC on $SiO_2$ is required, and SiC cannot be grown directly on $SiO_2$. A new SiC die made out of only SiC can be attached to the silicon photonics die through a die-to-die connecting method, such as transferring the SiC thin film to a $SiO_2$ film on a substrate, such as a silicon wafer or a silicon-on-insulator (SOI) wafer having a very thin silicon top layer, or performing surface treatment to form a buffer layer before the SiC layer growth on a silicon based substrate.

In summary, various techniques of fabricating the hybrid microring resonator with SiC include: 1) growing SiC on top of silicon photonics through an intermediate layer plus PVD deposition; 2) performing flip-chip of SiC die directly on the silicon photonics with light inputs and outputs through waveguides; 3) performing flip-chip of SiC die directly on the silicon photonics with light inputs and outputs through vertical grating couplers; 4) attaching through a polymer glass interposer, where the silicon carbide die and the silicon photonics die are next to each other; and 5) attaching the SiC die through a fiber, which is connected to each die through waveguide tapers.

The techniques of fabricating the hybrid microring resonator with SiC are not limited to the above listed methods, and other techniques may be use as long as they allow high fabricating yield while ensuring maximum transfer of optical light from the silicon carbide die to the silicon photonics die.

As shown in FIG. 3, the broad wavelength output (wavelength 1 to wavelength N) of the microring resonator is coupled to a transverse bus waveguide of multiple wavelengths, followed by a number of microring modulators matching individual wavelengths, so each microring modulator modulates one wavelength directly. Therefore, specific wavelengths are extracted by corresponding microring resonators and are modulated individually. Each of the N microring modulators is tailored to a different wavelength.

By adjusting the diameter of the microring resonator and the decoupling distance between the ring and the traverse waveguide, the free spectral range and, hence, the wavelength difference of N channels in the frequency comb can be selected.

Figure 4A:
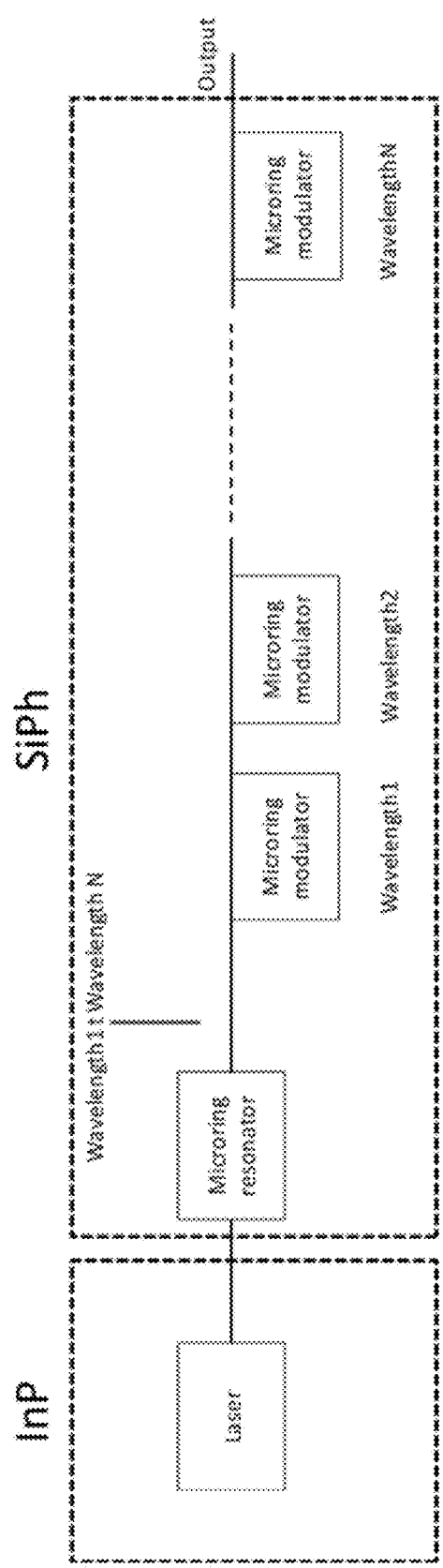
FIG. 4A shows a schematic diagram of an exemplary configuration with the InP laser die interconnected to the frequency comb generator on the silicon photonics die, according to some embodiments of the current disclosure.

FIG. 4A shows a schematic diagram of an exemplary configuration with the InP laser die interconnected to the frequency comb generator on the silicon photonics die, according to some embodiments of the current disclosure.

Partitioning of the different system functionalities among different materials leads to different configurations. As shown in FIG. 4A, the laser is implemented in the InP die and the microring resonator for comb generation is implemented in the silicon photonics (SiPh) die. Other components, such as the optical filters which generate wavelength 1 to wavelength N, and the microring modulators are also implemented on the silicon photonics die. It is possible to also include a nonlinear non-silicon material, such as SiC on the silicon substrate for comb generation.

Figure 4B:
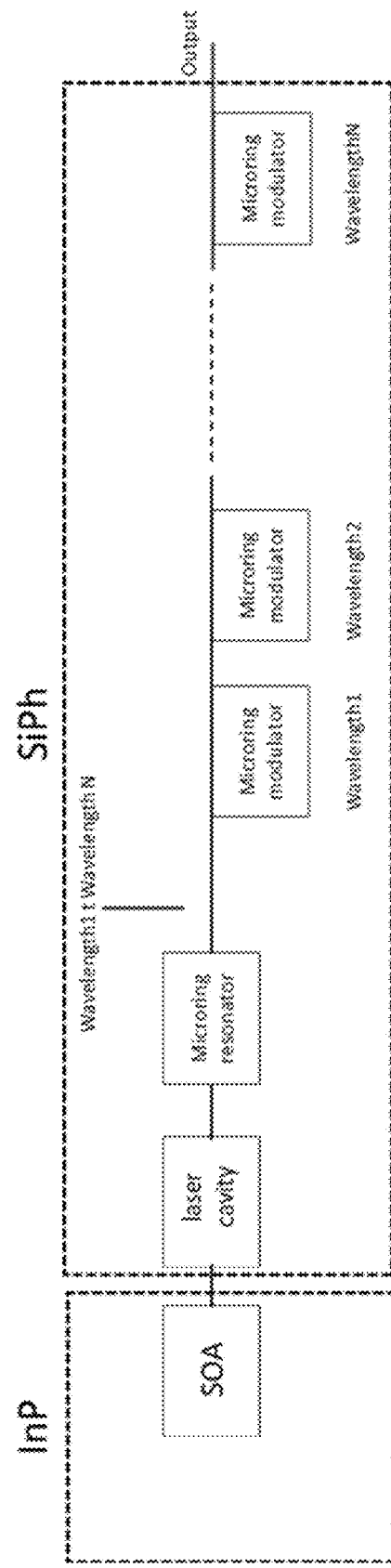
FIG. 4B shows a schematic diagram of another exemplary configuration with a hybrid InP die containing a laser/amplifier source attached to the silicon photonics die containing a laser cavity and a frequency comb generator, according to some embodiments of the current disclosure.

FIG. 4B shows a schematic diagram of another exemplary configuration with a hybrid InP die containing a laser/amplifier source attached to the silicon photonics die containing a laser cavity and a frequency comb generator, according to some embodiments of the current disclosure.

In another configuration shown in FIG. 4B, the laser cavity can be hybrid. The laser oscillator is built on the side of the silicon photonics die, while the gain block that provides amplification by the semiconductor optical amplifier (SOA) is grown on the InP die. The other optical filtering components and feedback mechanisms to generate wavelength 1 to wavelength N are also fabricated on the silicon photonics die, via applying techniques, for example, a Bragg grating or an arrangement of a microring resonator and optical waveguide couplers.

A transverse bus waveguide, as shown in FIG. 3, is applied in FIG. 4A and FIG. 4B, following the microring resonator. Modulation of each individual wavelength is performed similarly as well. Therefore, the functions and structures of those modulation parts will not be repeated here.

There are different techniques of implementation to modulate the light coming out of the frequency comb generator. In another exemplary embodiment, the microring resonator creates a number of signals at equidistantly spaced wavelengths, then the different wavelengths are filtered by dedicated filters. Each filter has a central wavelength designed to match one of the signals at that wavelength only. The signal from that filter, which is a narrow wavelength band (sometimes called a single wavelength, even though it has a bandwidth), is then sent to an optical modulator, for example, a Mach-Zehnder modulator, which modulates the optical signal by an electrical signal. The electrical signal may be a non-return to zero (NRZ) modulator, a four-level pulse amplitude modulator (PAM-4), or a modulator applying any multi-level signal conveying device technique, for example, like coding digital information into any format.

Figure 5A:
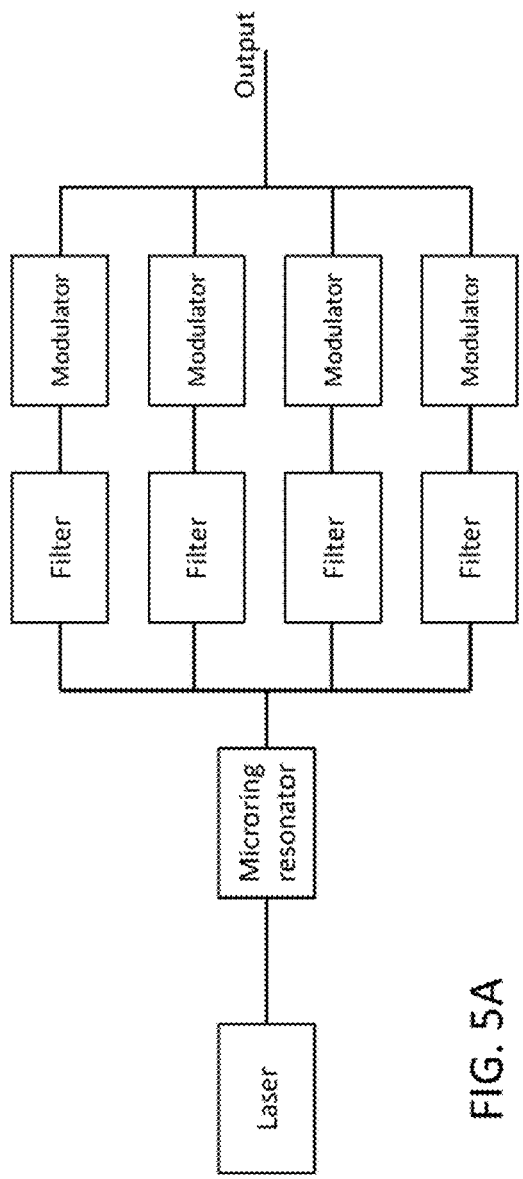
FIG. 5A shows a schematic block diagram of a frequency comb generator of 4-channel scheme, according to some embodiments of the current disclosure.
Figure 5B:
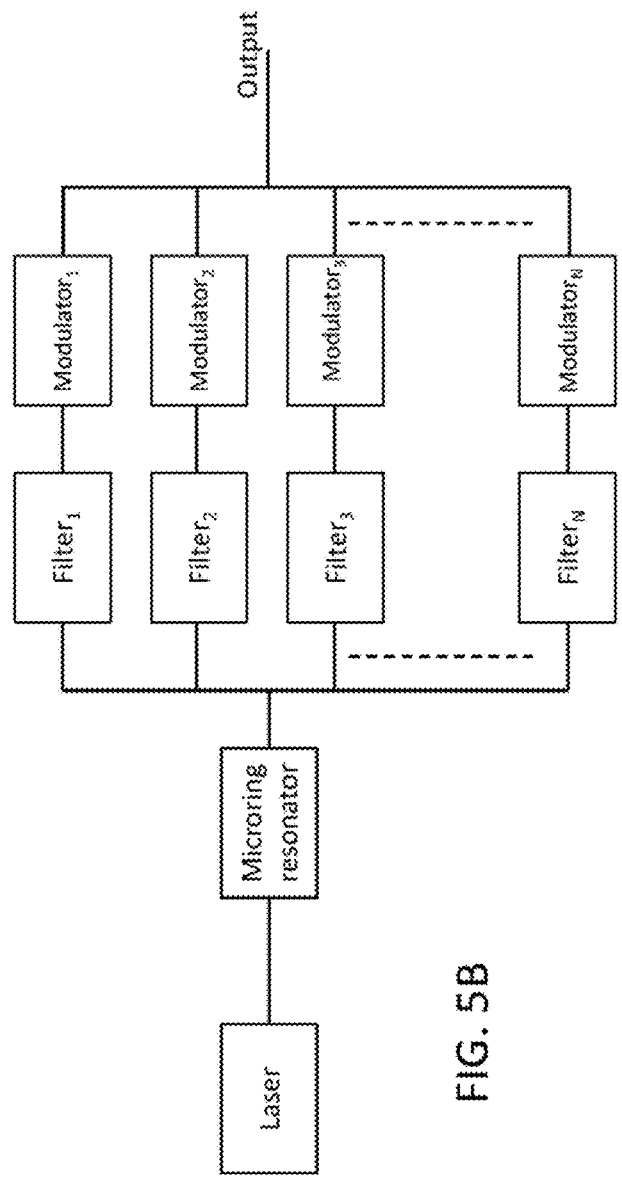
FIG. 5B shows a schematic block diagram of a frequency comb generator of N-channel scheme, according to some embodiments of the current disclosure.

The filtering technique shown in FIG. 5A and FIG. 5B, implements a dedicated filter for each frequency comb line responding to one wavelength band. This dedicated filter extracts the wavelength band and sends it to one comb line, and a modulator performs phase modulation or amplitude modulation according to applications. The modulator can be a Mach-Zehnder modulator or a microring modulator.

FIG. 5A shows a schematic block diagram of a frequency comb generator having a four-channel scheme, according to some embodiments of the current disclosure. In the four-channel scheme of FIG. 5A, the four-channel frequency comb generator system includes a light source on an indium phosphide die. The light source can be a laser and/or an amplifier combined into the laser block. The emitted single wavelength laser light is guided into a microring resonator on the silicon photonics die. The microring resonator combs out multiple lines of different frequencies, a number of filters are used to separate the lines of the frequency comb, and a number of modulators, each following one of the filters, are used to independently modulate that frequency line. In the exemplary case of four channels depicted in FIG. 5A, the microring resonator connects to four channels, and each channel is formed of one filter and one modulator connected in series. The outputs of the four channels are combined into optical fiber cables.

FIG. 5B discloses another system similar to FIG. 5A but has N-channels. The descriptions of the N-channeled system should be similar to the above four-channel scheme and thus will not be repeated here.

In some other applications, the frequency comb generator is used in large multi-chip modules (MCM). Typically, the indium phosphide dies and the silicon photonics dies do not have to be co-integrated. Instead, they are interconnected through a fiber connection or polymer flex waveguides.

Figure 6A:
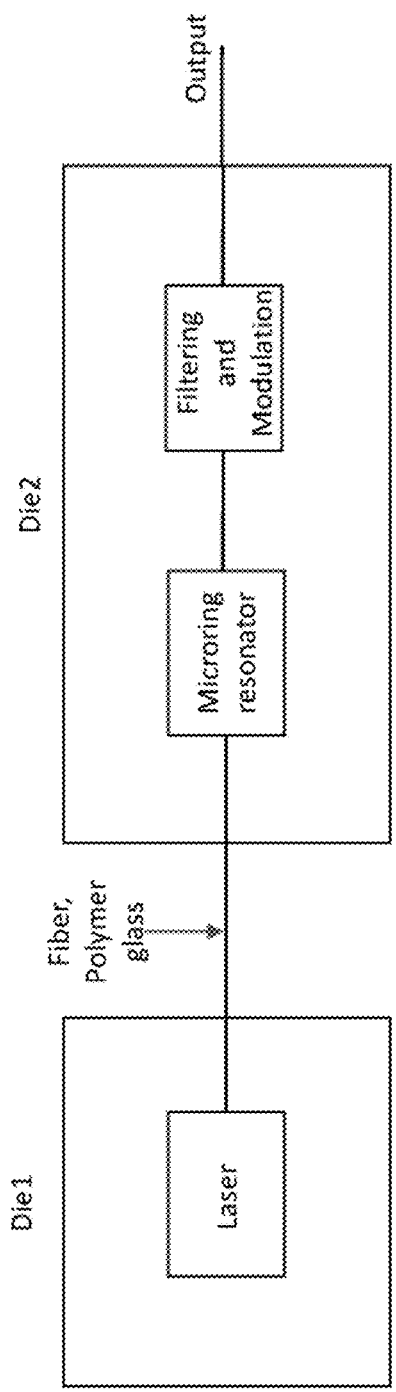
FIGS. 6A-6C show schematic diagrams of three types of frequency comb generators implemented in multi-chip modules (MCM) where an indium phosphide die, a silicon photonics die, and an additional electronics die are used, according to some embodiments of the current disclosure.
Figure 6B:
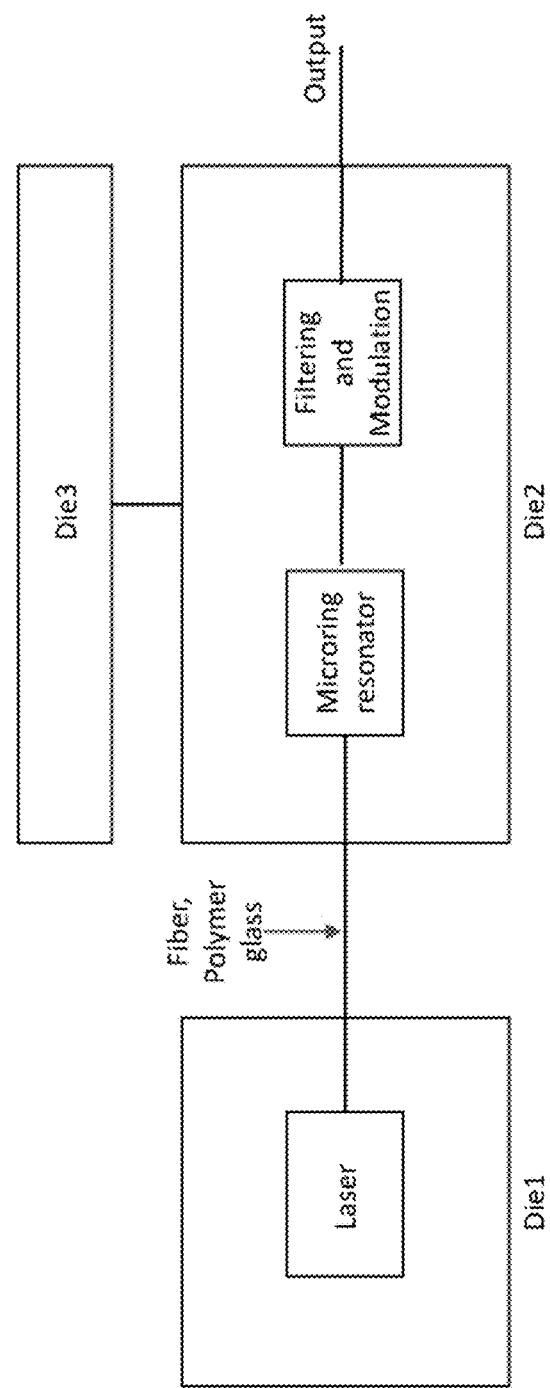
Figure 6C:
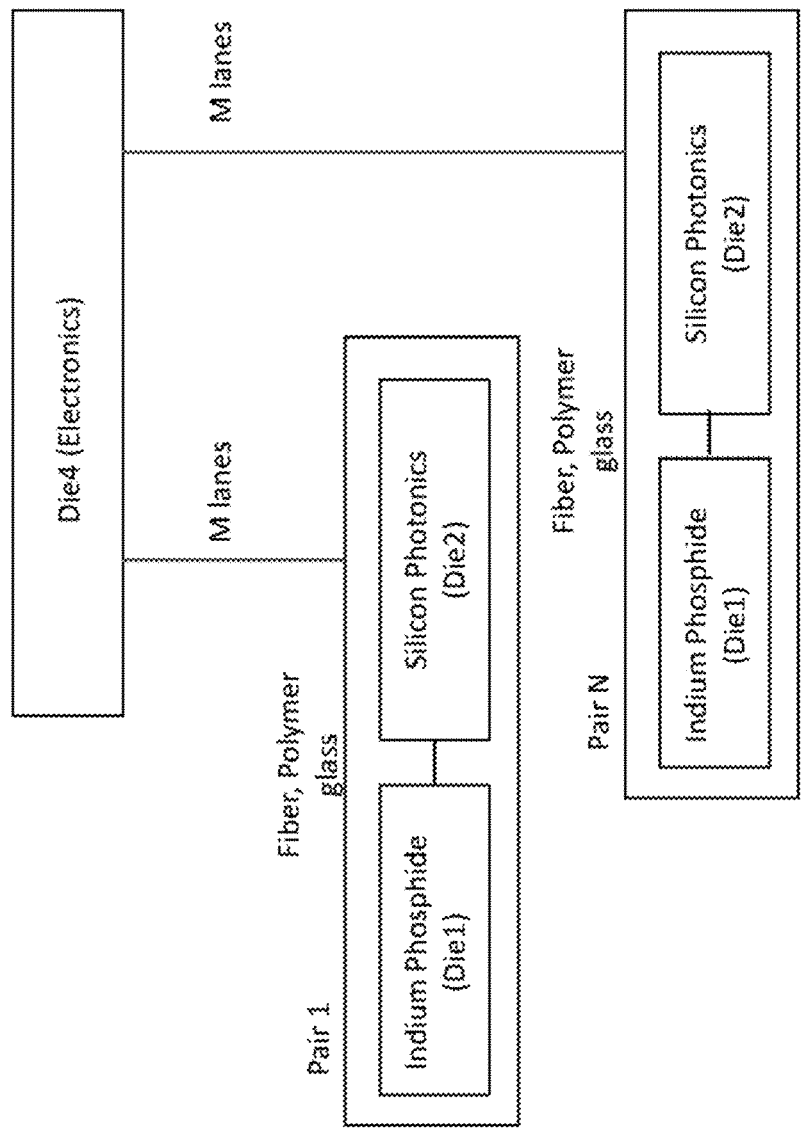

FIGS. 6A-6C show schematic diagrams of three types of frequency comb generators implemented in multi-chip modules (MCM), which include an indium phosphide die, a silicon photonics die, and an additional electronics die, according to some embodiments of the current disclosure.

The three types of frequency comb generators in large MCM chips may use separates dies, which do not need to be integrated as described with respect to the above-mentioned systems. Examples of these systems are described below and illustrated in FIGS. 6A to 6C.

In FIG. 6A, there are two dies—the InP Die 1 and silicon photonics Die 2. The laser source is fabricated on an indium phosphide material (Die 1) and a second integrated circuit is fabricated in a silicon photonics chip (Die 2). The two dies are interconnected through a conduit made of a fiber, a polymer waveguide, a glass waveguide, or other interconnecting lines. The silicon photonics Die 2 includes a microring resonator to complete the frequency comb operation, as well as filtering and modulation blocks to select and modulate each separate frequency line.

In FIG. 6B, the system in FIG. 6A is extended with a third chip (die 3), which is an electronics die containing all the systems for electronic manipulation of signals, including but not limited to equalization, coding, switching, and logic operations.

In FIG. 6C, the multichip module (MCM) implementation is further extended. A central Die 4 (electronics) containing all signal manipulation electronics is surrounded by N pairs of photonics dies, each pair comprising a Die 1 of indium phosphide for light source and a Die 2 of silicon photonics for frequency combing, and the Die 1 and Die 2 are interconnected by a conduit of optical fibers, a polymer waveguide, or a glass waveguide, similar to the system described in FIG. 6A. The central electronics Die 4 is connected to each of the photonics pair Die 1 and Die 2 through M lanes of electrical connections, which may comprise power lanes and low frequency and high frequency lanes.

The integration of frequency comb generators into transceivers also offers the opportunity to extend a transceiver from a wavelength WDM source, for example, a four-wavelength channel scheme, to coarse-WDM (CWDM) as in eight wavelength channels. The similar frequency comb generators can be used to generate either four wavelengths to feed a WDM link or eight wavelengths to feed a CWDM link. The following figures describe these extensions.

Figure 7:
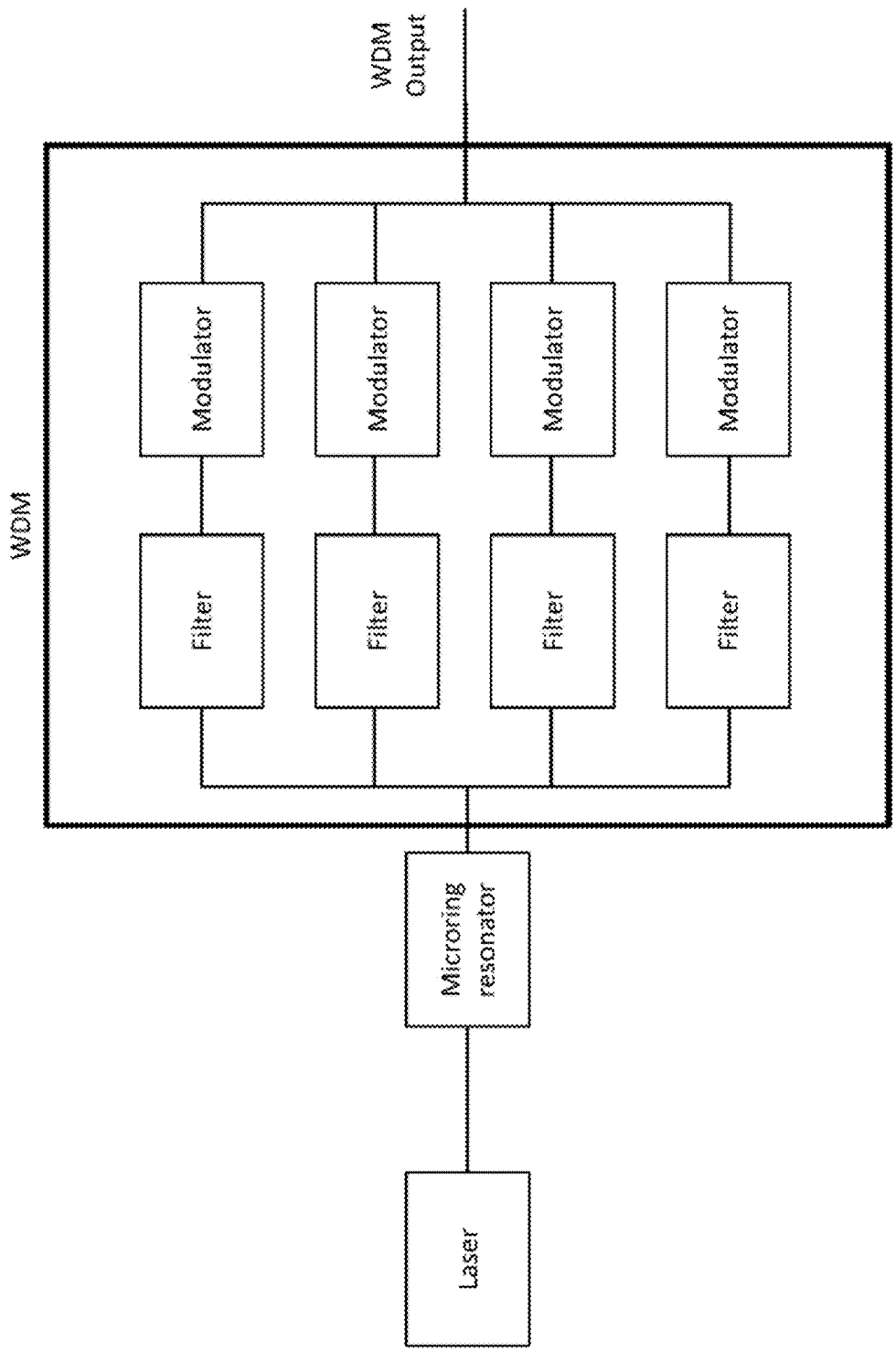
FIG. 7 shows a schematic diagram of a frequency comb generator for wavelength-division multiplexing (WDM) operation, according to some embodiments of the current disclosure.

FIG. 7 shows a schematic diagram of a frequency comb generator for WDM operation, according to some embodiments of the current disclosure.

In FIG. 7, a laser is built on the indium phosphide die, followed by a microring resonator, filters, and modulators built on the silicon photonics die. The output of the laser is non-linearly broadened or split by the microring resonator and separated into four channels by wavelength-division-multiplexing techniques. The outputs of the four channels are assembled into waveguide or fiber optical cables.

Figure 8:
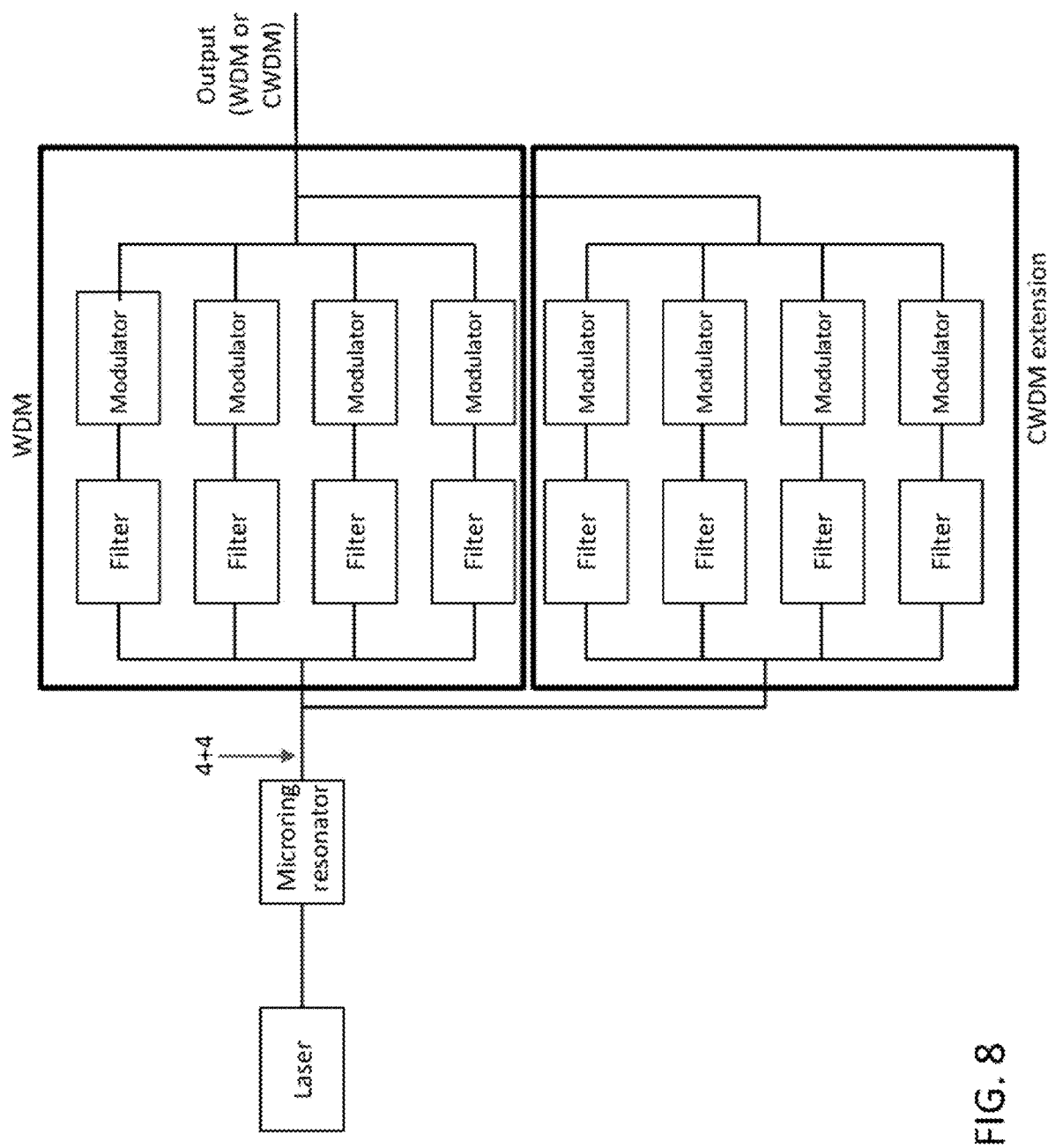
FIG. 8 shows a schematic diagram of a frequency comb generator for coarse Wavelength Division Multiplexing (CWDM) dual operation, according to some embodiments of the current disclosure.

FIG. 8 illustrates a schematic diagram of a frequency comb generator for CWDM dual operation, according to some embodiments of the current disclosure.

FIG. 8 shows an extension of the four-channel WDM system into an eight-channel system. A coarse wavelength division multiplexing is a wavelength multiplexing technology for city and access networks. Typical transmission is realized using 8 channels with wavelengths between 1270 nm and 1610 nm. Due to the channel spacing of relative coarse 20 nm, cost-effective lasers can be used. In FIG. 8, the eight channel CWDM combines two of the four-channel WDMs illustrated in FIG. 7. A laser is built on the indium phosphide die, and the output of the laser is non-linearly broadened or split by the microring resonator, generating eight wavelength bands (4+4), and separated into two different buses by wavelength-division-multiplexing techniques. The laser and the microring resonator are shared by all channels of the WDMs. The following filters and modulators are built on two silicon photonics dies, each responsible for one four-channel WDM. The outputs of the four channels are assembled into waveguide or fiber optical cables. This scheme can be used in combination with the approaches in FIG. 3 or FIG. 5B.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed, and that modifications and other embodiments are intended to be included within the scope of the appended claims. Although specific terms are employed herein, they are used in a generic and descriptive sense only and not for purposes of limitation.

What is claimed is:

1. A photonics frequency comb generator, comprising:
    an indium phosphide substrate comprising a light source grown thereon;
    a silicon photonics substrate, the silicon photonics substrate comprising an optical wavelength generator constructed thereon using non-silicon material to increase non-linear properties of the optical wavelength generator, wherein the indium phosphide substrate and the silicon photonics substrates are interconnected using an optical waveguide;
    a waveguide bus in optical communication with the optical wavelength generator,
    wherein the optical wavelength generator is a microring resonator interconnected with the light source configured to convert a first wavelength generated by the light source into a plurality of second wavelengths and to distribute the plurality of second wavelengths to a plurality of microring modulators via the waveguide bus;
    an input terminal connecting to the indium phosphide substrate; and
    an output terminal connected to the silicon photonics substrate.

2. The photonics frequency comb generator, according to claim 1, wherein the light source is a laser grown on the indium phosphide substrate, and wherein the laser emits the first wavelength.

3. The photonics frequency comb generator, according to claim 1, wherein the silicon photonics substrate comprises:
    filters and modulators connected to the microring resonator; and
    wherein one of the filters selects one of the plurality of second wavelengths and transmits said second wavelength to one of the modulators in a one-to-one relationship.

4. An M-channel WDM module, comprising the photonics frequency comb generators according to claim 3, wherein a number of filters and a number of modulators are both M×4, wherein M is a positive integer 1, 2, . . . M and M×4 is 4, 8, . . . M×4.

5. An M-channel CWDM module, comprising the photonics frequency comb generators according to claim 3, wherein a number of filters and a number of modulators are both M'×4, wherein M' is a positive integer 1, 2, . . . M'×4.

6. The photonics frequency comb generator, according to claim 1, wherein the plurality of second wavelengths from the microring resonator are distributed to the plurality of microring modulators using a plurality of filters in a one-to-one relationship such that each modulator modulates one wavelength directly.

7. The photonics frequency comb generator, according to claim 1, wherein each of the plurality of microring modulators is tailored to modulate a specific wavelength from the plurality of second wavelengths.

8. A photonics frequency comb generator, comprising:
an indium phosphide substrate comprising a light source grown thereon;
a silicon photonics substrate, the silicon photonics substrate comprising a non-linear optical wavelength generator constructed thereon, wherein the indium phosphide substrate and the silicon photonics substrate are interconnected using an optical waveguide,
a waveguide bus in optical communication with the optical wavelength generator,
wherein the non-linear optical wavelength generator is a microring resonator interconnected with the light source configured to convert a first wavelength generated by the light source into a plurality of second wavelengths and to distribute the plurality of second wavelengths to a plurality of microring modulators via the waveguide bus, wherein each of the plurality of modulators is tailored to modulate a specific wavelength from the plurality of second wavelengths;
an input terminal connecting to the indium phosphide substrate; and
an output terminal connected to the silicon photonics substrate.

9. The photonics frequency comb generator, according to claim 8, wherein the light source is a laser grown on the indium phosphide substrate, and wherein the laser emits the first wavelength.

10. The photonics frequency comb generator, according to claim 9, wherein the microring resonator comprising hybrid materials, and wherein the microring resonator is interconnected to the laser.

11. The photonics frequency comb generator, according to claim 10, wherein the hybrid materials comprise non-silicon materials, such as silicon carbide (SiC) or silicon germanium (SiGe).

12. The photonics frequency comb generator, according to claim 11, wherein the SiC material is fabricated using techniques comprising: 1) growing SiC on top of a silicon photonics substrate through an intermediate layer or PVD deposition; 2) performing flip-chip of a SiC die directly on the silicon photonics substrate; 3) performing flip-chip of the SiC die directly on the silicon photonics substrate, 4) attaching the SiC die through a polymer glass interposer, where the SiC die and the silicon photonics substrate are next to each other; and 5) attaching the SiC die to the silicon photonics substrate through a fiber, which is connected to the SiC die and the silicon photonics substrate through waveguide tapers.

13. The photonics frequency comb generator, according to claim 8, wherein converting the first wavelength into the plurality of second wavelengths is achieved by adjusting a geometric size of the microring resonator and a distance between the microring resonator and the waveguide bus.

14. The photonics frequency comb generator, according to claim 8, wherein the light source grown on the indium phosphide substrate is a semiconductor optical amplifier (SOA) configured to provide gain to the first wavelength emitted by a laser oscillator cavity on the silicon photonics substrate.

15. The photonics frequency comb generator, according to claim 8, wherein the non-linear optical wavelength generator is constructed on a silicon photonics substrate using non-silicon material to increase non-linear properties of the non-linear optical wavelength generator.

16. A multi-chip module, comprising:
a photonics frequency comb generator, comprising:
an indium phosphide substrate comprising
a light source grown thereon;
a silicon photonics substrate, the silicon photonics substrate comprising an optical wavelength generator constructed thereon using non-silicon material to increase non-linear properties of the optical wavelength generator;
wherein the indium phosphide substrate and the silicon photonics substrate are interconnected using an optical waveguide;
a waveguide bus in optical communication with the optical wavelength generator,
wherein the optical wavelength generator is a microring resonator interconnected with the light source configured to convert a first wavelength generated by the light source into a plurality of second wavelengths and to distribute the plurality of second wavelengths to a plurality of microring modulators via the waveguide bus;
an input terminal connecting to the indium phosphide substrate; and
an output terminal connected to the silicon photonics substrate.

17. The multi-chip module, according to claim 16, wherein the optical waveguide connecting the indium phosphide substrate and the silicon photonics substrate comprises one of an optical fiber, a polymer waveguide, or a glass waveguide.

18. The multi-chip module, according to claim 17, wherein the light source is a laser grown on the indium phosphide substrate, and wherein the laser emits the first wavelength.

19. The multi-chip module, according to claim 18, further comprising a third die connected to the silicon photonics substrate, wherein the third die is an electronics die comprising circuits for electronic manipulation of signals, including equalization, coding, switching, and logic operations.

20. A multi-chip module, comprising N photonics frequency comb generators according to claim 16, wherein each of the N photonics frequency comb generators comprises a pair of the indium phosphide substrate and the silicon photonics substrate.

21. The multi-chip module, according to claim 20, further comprising an electronics die connecting to the N photonics frequency comb generators respectively via a multi-lane waveguide, wherein the electronics die comprises circuits for electronic manipulation of signals, including equalization, coding, switching, and logic operations.

22. The multi-chip module, according to claim 16, wherein each of the plurality of microring modulators is tailored to modulate a specific wavelength from the plurality of second wavelengths.

* * * * *